United States Patent
Grunes et al.

(10) Patent No.: US 10,955,739 B2
(45) Date of Patent: Mar. 23, 2021

(54) CONSISTENT MASK TARGETING THROUGH STANDARDIZED DROP-IN-CELLS

(71) Applicant: Intel Corporation, Santa Clara, CA (US)

(72) Inventors: Harsha Grunes, Beaverton, OR (US); Christopher N. Kenyon, Portland, OR (US); Sven Henrichs, San Jose, CA (US)

(73) Assignee: Intel Coropration, Santa Clara, CA (US)

( * ) Notice: Subject to any disclaimer, the term of this patent is extended or adjusted under 35 U.S.C. 154(b) by 0 days.

(21) Appl. No.: 16/647,418

(22) PCT Filed: Nov. 28, 2017

(86) PCT No.: PCT/US2017/063402
§ 371 (c)(1),
(2) Date: Mar. 13, 2020

(87) PCT Pub. No.: WO2019/108164
PCT Pub. Date: Jun. 6, 2019

(65) Prior Publication Data
US 2020/0209734 A1    Jul. 2, 2020

(51) Int. Cl.
*G03F 1/36* (2012.01)

(52) U.S. Cl.
CPC ................. *G03F 1/36* (2013.01)

(58) Field of Classification Search
CPC .............................................. G03F 1/36
USPC ............................. 716/50, 53, 55
See application file for complete search history.

(56) References Cited

U.S. PATENT DOCUMENTS

| | | | |
|---|---|---|---|
| 7,882,456 B2* | 2/2011 | Zach | G03F 7/70441 716/55 |
| 8,141,008 B2* | 3/2012 | Zach | G03F 1/36 716/54 |
| 8,295,584 B2 | 10/2012 | Sato et al. | |
| 9,904,757 B2* | 2/2018 | Abdo et al. | G06F 30/398 |
| 2006/0236271 A1* | 10/2006 | Zach | G03F 1/36 716/30 |

(Continued)

FOREIGN PATENT DOCUMENTS

JP    2009-222609    10/2009

OTHER PUBLICATIONS

International Search Report and Written Opinion for International Patent Application No. PCT/US2017/063402 dated Aug. 20, 2018, 10 pgs.

(Continued)

*Primary Examiner* — Sun J Lin
(74) *Attorney, Agent, or Firm* — Schwabe, Williamson & Wyatt, P.C.

(57) ABSTRACT

A mask process development having a consistent mask targeting is described. A method includes receiving an integrated circuit (IC) design. A test mask is generated that converts the IC design into one or more physical layouts. A set of one or more sub-resolution assist features (SRAFs) is inserted into the test mask. The set of one or more SRAFs is inserted into one or more other masks, which are derived from the test mask for mask targeting, such that the test mask and the one or more other masks include a same set of the one or more SRAFs.

25 Claims, 6 Drawing Sheets

(56) References Cited

U.S. PATENT DOCUMENTS

2016/0299418 A1 10/2016 Hung
2016/0327855 A1 11/2016 Chen
2017/0193150 A1 7/2017 Abdo et al.
2017/0242333 A1 8/2017 Li et al.
2017/0322485 A1 11/2017 Fujimura

OTHER PUBLICATIONS

International Preliminary Report on Patentability for International Patent Application No. PCT/US2017/063402, dated Jun. 11, 2020, 7 pgs.

* cited by examiner

CONSISTENT MASK TARGETING THROUGH STANDARDIZED DROP-IN-CELLS

CROSS-REFERENCE TO RELATED APPLICATION

This patent application is a U.S. National Phase Application under 35 U.S.C. § 371 of International Application No. PCT/US2017/063402, filed Nov. 28, 2017, entitled "CONSISTENT MASK TARGETING THROUGH STANDARDIZED DROP-IN-CELLS," which designates the United States of America, the entire disclosure of which is hereby incorporated by reference in its entirety and for all purposes.

TECHNICAL FIELD

Embodiments of the disclosure are in the field of semiconductor photolithography and, in particular, consistent mask targeting through standardized drop-in-cells.

BACKGROUND

Demand for compact semiconductor devices has driven production of semiconductor devices with smaller and smaller features as time progresses. As a result, mask design for producing these smaller features is no longer a trivial task. For example, in the past, when features were larger, features in masks designed to produce the features in the semiconductor device had similar shape as the features in the semiconductor device. In contrast, features in masks for producing today's much smaller features in semiconductor devices may not be recognizable to a human observer as corresponding to the features in the semiconductor device.

Software tools are often used to aid in the design of masks for producing very small features in semiconductor devices. Sometimes mask features designed with the aid of these software tools are at or near manufacturing tolerances for mask manufacturing (e.g., tolerances in dimensions). As a result, infidelities in manufactured masks sometimes occur, particularly in features at or near manufacturing tolerances. Infidelities in masks can lead to infidelities in the features of semiconductor devices manufactured with the masks. Some of these infidelities in the features of the semiconductor devices may prevent the semiconductor devices from functioning properly.

DESCRIPTION OF THE EMBODIMENTS

Figure 1:
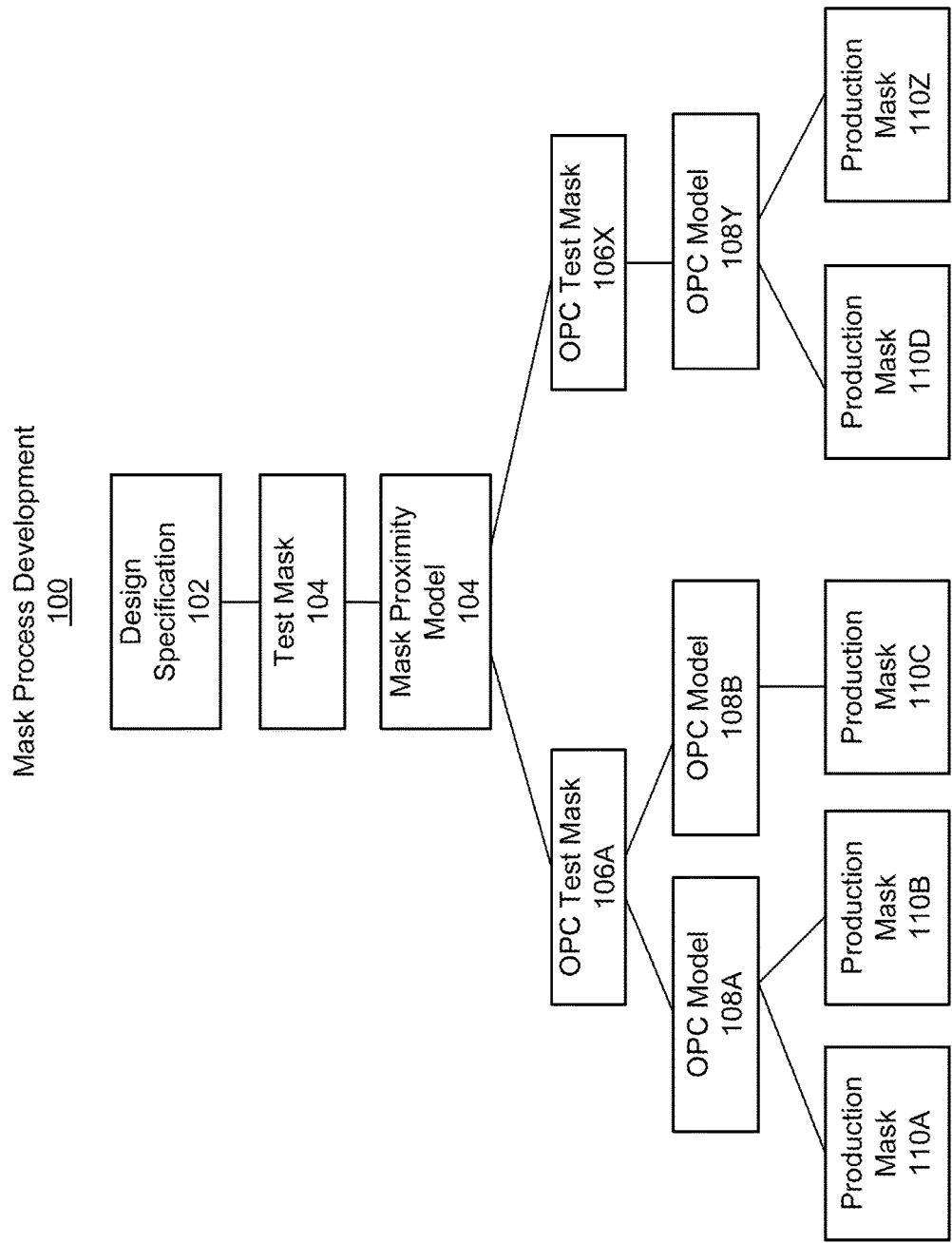
FIG. 1 is a simplified process flow of a mask process development.
Figure 2A:
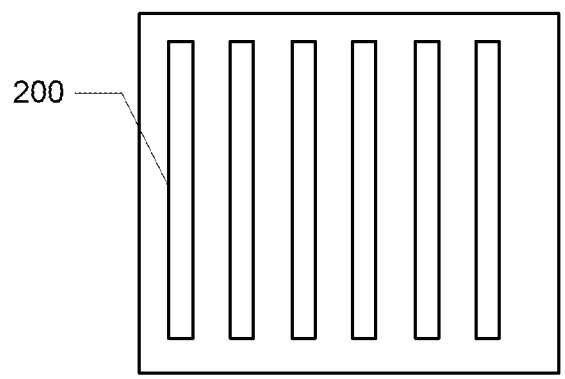
FIGS. 2A-2F illustrate examples of conventional geometric shapes used as target features or drop-in cells.
Figure 2B:
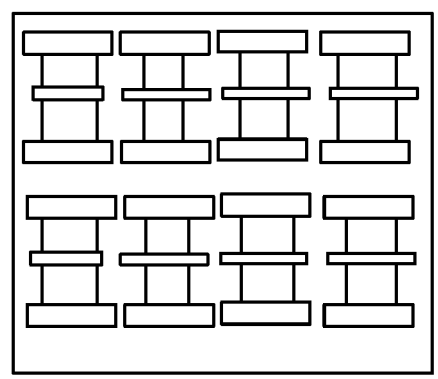
Figure 2C:
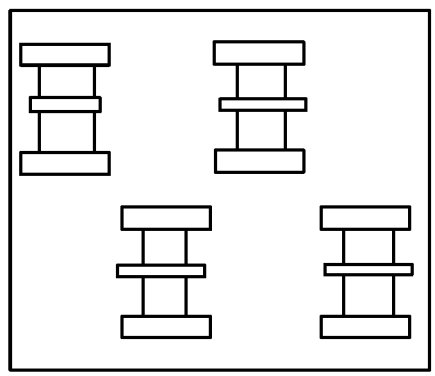
Figure 2D:
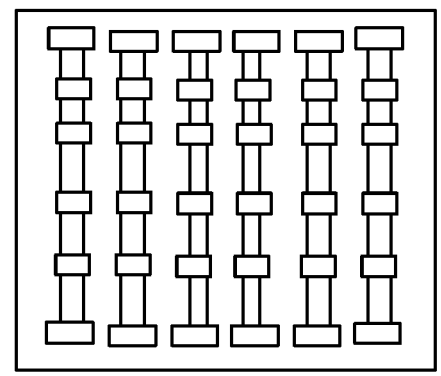
Figure 2E:
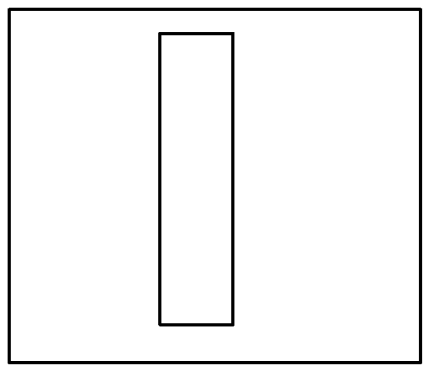
Figure 2F:
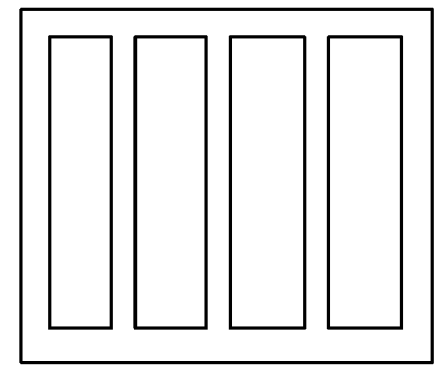

Consistent mask targeting through standardized drop-in-cells is described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Various operations will be described as multiple discrete operations, in turn, in a manner that is helpful in understanding the disclosure. The order in which the operations are presented in the description, however, should not be construed to imply that these operations are necessarily order dependent. In particular, these operations need not be performed in the order of presentation. Rather, in some embodiments, the order may be modified.

Disclosed herein is the use of sub-resolution assist features to assure consistent mask targeting for a given mask process from early mask process development stages, through mask and OPC modeling, to the production deployment of the mask process across many different fabrication layers. The disclosed embodiments allow for improved mask line control and improved mask feedback systems. Thus, the disclosed embodiments result in improved mask critical dimension (CD) uniformity, faster excursion detection/management, and ultimately, improved wafer yield.

As used herein, the term "wafer" refers to an apparatus that a mask is intended to pattern features onto (e.g., by using lithography). By way of non-limiting example, a wafer may include a semiconductor wafer (sometimes referred to herein as "wafer") or semiconductor device. As used herein, the term "semiconductor wafer" refers to wafers or chips of semiconductor material (e.g., silicon, III-V semiconductor material, II-VI semiconductor material, other semiconductor materials, or combinations thereof). It should be noted that a semiconductor wafer may include a semiconductor material substrate alone or with other materials and/or features formed therein or thereon. Also, a semiconductor wafer may include a silicon on insulator (SOI) substrate (e.g., a silicon on glass substrate, a silicon on sapphire substrate, etc.). In some instances the term "semiconductor wafer" may refer to an apparatus formed on or in a semiconductor substrate, but that has had part or all of the semiconductor substrate removed therefrom.

It will be appreciated by those of ordinary skill in the art that one or more masks may be used at various different stages of manufacturing of a semiconductor device. The mask design principles disclosed herein may be applied to the design of any one or more of these masks used at any of the various different stages.

FIG. 1 is a simplified process flow of a mask process development. The mask process development 100 may begin with a design specification 102 that represents an integrated circuit (IC) design. In one embodiment, the design specification 102 may comprise computerized data files representing features of a target wafer pattern as millions or trillions of polygons on various layers. The data files representing the various layers are shipped to a mask shop, which use mask-writing equipment to convert data layers into a corresponding mask, e.g., a test mask 104, OPC test masks 106A-106X, and production masks 110A-110Z.

In further detail, from the design specification 102, the test mask 104 is developed in which the IC design from the design specification 102 is converted into one or more physical layouts. The test mask 104 is all the features that are desired to be printed on the wafer and sets various mask parameters that will be used by different fabrication tools. The test mask 104 may be used to generate a mask proximity model 104. A mask proximity model may be applied to correct subsequent masks, such that the fidelity of the mask is maximized.

Optionally, the mask proximity model 104 can then be used to generate one or more optical proximity correction (OPC) test masks 106A-106X. The OPC test masks 106A-106X are a set of test patterns used to represent the suite of IC design layouts that one or more lithographic layers will need to pattern on wafer. The OPC test masks 106A-106X are each used to generate one or more OPC models 108A-108Y. Each of the OPC models 108A-108Y is used to aid the design of one or more production masks 110A-110Z. The production masks 110A-110Z are then shipped to a fab where they are used to repeatedly manufacture the designs on wafers.

The process of generating the various types of masks is not a one-to-one correlation. The mask process development 100 can be used to make many OPC test masks 106A-106X, each of the OPC test masks 106A-106X can be used to make many OPC models 108A-108Y, and each of the OPC models 108A-108Y can be used to make many production masks 110A-110Z.

A typical semiconductor device may comprise many different layers, e.g., 50 layers, for example, and may require a similar number of lithographic process steps in order to manufacture the semiconductor device. Accordingly, each layer may have a corresponding mask with different features. Many of the lithographic process steps may have different technology nodes, which refer to a specific semiconductor manufacturing process and its design rules. Different nodes often imply different circuit generations and architectures. Generally, the smaller the technology node means the smaller the feature size, producing smaller semiconductor devices. Thus, some of the masks (and/or layers in the masks) may share the same mask process, but may have different technology nodes and/or different designs, and therefore must meet different design requirements.

The goal of the mask process development is to print the target wafer pattern as accurately as possible on the wafer compared to the design specification. In order to determine the accuracy of the process, a scanning electron microscope (SEM), or other suitable measuring device, may be used to measure certain features produced by one or more of the masks depicted in FIG. 1. For example, if the design specification 102 calls for a feature that is 100 nm in length, then the SEM may be used to verify whether that feature prints at the specified length. Because measuring every feature on every layer of every masks would be too burdensome and time consuming, the masks are provided with special features for this purpose, referred to herein as drop-in cells or target features.

FIGS. 2A-2F illustrate examples of conventional geometric shapes used as drop-in cells 200. A conventional drop-in cell 200 is a collection of polygons arrayed across a mask so that a mask shop can target the mask and measure the features/polygons to determine the extent of mask process errors. The example drop-in cells 200 shown in each of the FIGS. 2A-2F may represent drop-in cells 200 used on different masks in the mask process development 100, and/or may represent drop-in cells 200 used on different layers. In addition, conventional drop-in cells 200 are sized lager than the resolution limit of the imaging system meaning that conventional drop-in cells 200 are eventually printed on the wafer.

Conventionally, the drop-in cells 200 for each of the masks may change over time during the mask process development 100. This means that aggregation of data/statistics is minimal, making it more difficult to identify outliers, collect sufficient data for feedback mechanisms. Additionally, systematic errors are introduced as layer-specific drop-in cells 200 may have different mask process errors than the original drop-in cell 200. This means that the fab or mask process for a given layer was mis-targeted.

Figure 3:
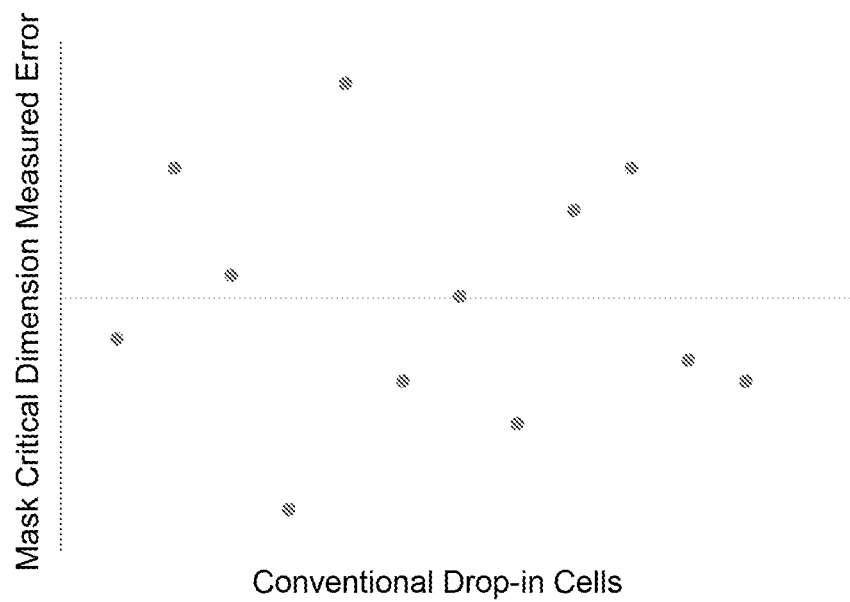
FIG. 3 illustrates a scatter plot showing mask critical dimension measured error for different conventional drop-in cells.

FIG. 3 illustrates a scatter plot showing mask critical dimension (CD) measured error for different conventional drop-in cells. The lack of stable drop-in-cells can lead to variation in mask targeting between mask development, OPC modeling, and production deployment, leading to mask targeting induced errors that are visible on the resulting wafer and impacting fabrication wafer yield. It also makes it more difficult to detect excursions due to the lack of accumulated data/statistics and harder to improve overall mask CD uniformity as a result.

In order to enhance the accuracy and the resolution of the pattern that is printed on the wafer. A variety of different optimization techniques are typically applied to the mask. One such technique is to add sub-resolution assist features or scattering bars to a mask. Sub-resolution assist features (SRAFs) are a type of resolution enhancement technology used to improve the manufacturability. These are usually small features in the form of parallel lines or spaces that are smaller than the resolution limit of the imaging system. In other words, the features are too small to be printed on the wafer through an imaging lens but they influence the lithographic behavior of the larger features that they are near. For example, SRAFs in the form of parallel lines running along either side of a solid line may improve the focus of the solid line.

Figure 4:
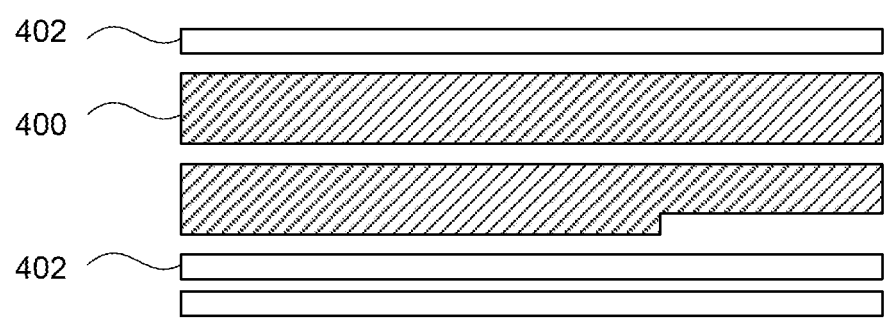
FIG. 4 is a simplified diagram illustrating a small portion of a conventional mask with main features and SRAFs.

FIG. 4 is a simplified diagram illustrating a small portion of a conventional mask with main features 404 and SRAFs 402. The features 404 are shown as examples of possible features and the shapes are simplified. In this example, the main features 400 are parallel line segments and the SRAFs 402 are applied above and below the main features 400.

SRAFs can be used to ensure that features will be printed correctly on the wafer even as the parameters of the printing process (focus, intensity, chemistry, wafer composition, etc.) vary through their anticipated range. The combined variation of these parameters of the printing process are sometimes referred to as the process window. SRAFs have been combined with other printing process enhancements such as optical proximity correction (OPC), off-axis illumination (OAD, alternating phase shifted mask (APSM) enhanced lithography, and attenuated phase shifted mask (EPSM) lithography.

According to the embodiments disclosed herein, consistent mask targeting is provided through the use of standardized drop-in cells. The use of standardized drop-in cells ensures that mask error is measured consistently from one mask to the other. In particular, disclosed is a new use of sub-resolution assist features (SRAFs) as standardized drop-in cells to assure consistent mask targeting for a given mask process from early mask process development stages, through mask and OPC modeling, to the production deployment of the mask process across many different fabrication layers. The disclosed embodiments allow for improved mask line control and improved mask feedback systems. Thus, the disclosed embodiments result in improved mask critical dimension (CD) uniformity, faster excursion detection/management, and ultimately, improved wafer yield.

Figure 5:
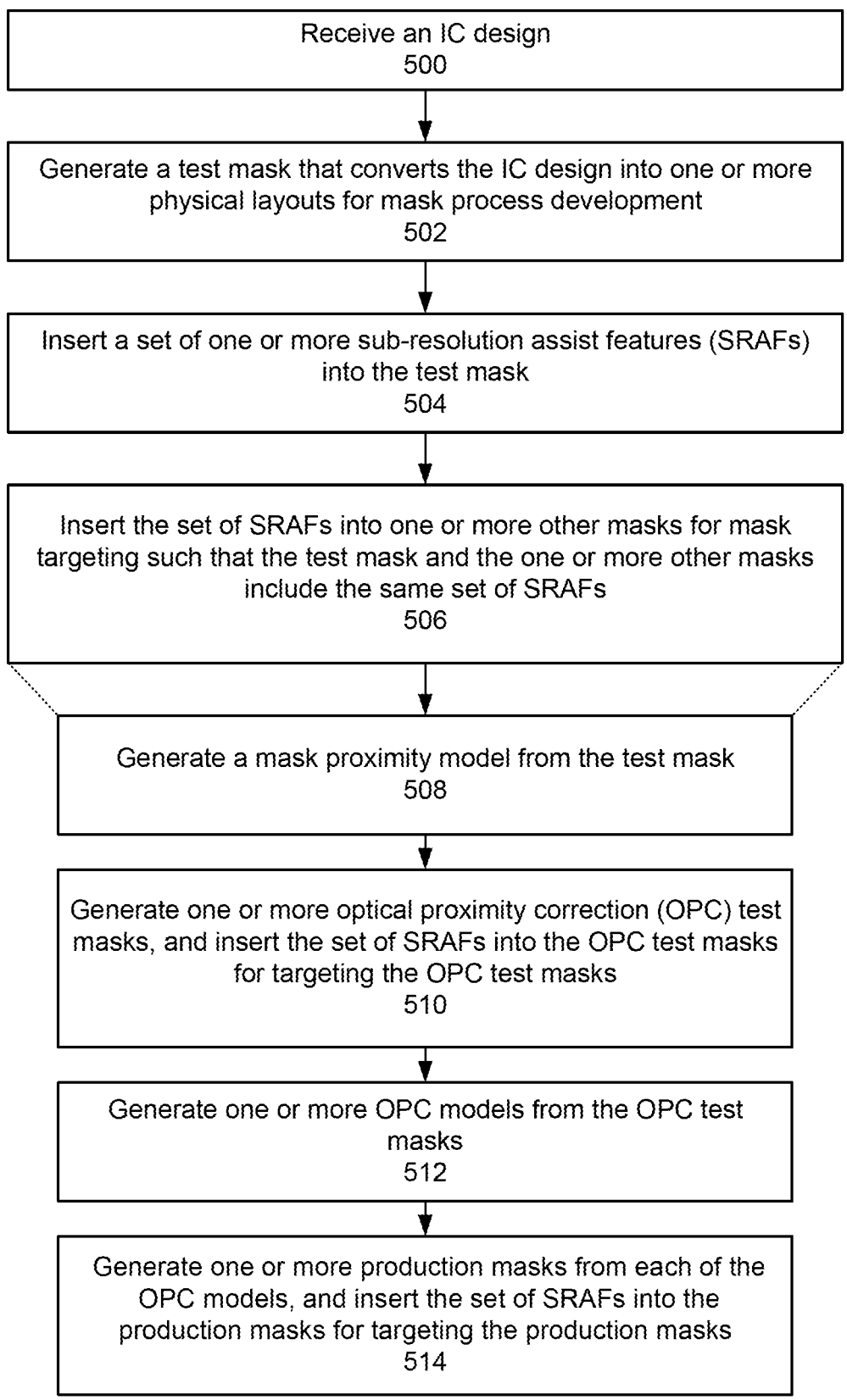
FIG. 5 is a flow diagram illustrating a mask process development having consistent mask targeting using SRAFs as standardized drop-in cells.

FIG. 5 is a flow diagram illustrating a mask process development having consistent mask targeting using SRAFs as standardized drop-in cells.

Referring to both FIGS. 1 and 5, the process may begin by receiving an integrated circuit (IC) design defining a plurality of different layers having different process requirements (block 500). In one embodiment, the process may include receiving a design specification that specifies the IC design. In one embodiment, a mask shop may receive the IC design, including a drop-in-cell layout for incorporation in the mask design, from the designer/creator of the IC design. The design shop must meet the designer's requirements of placement rules, i.e., a requirement regarding placing a minimum of drop-in cells into the layout with specifications on spacing within the full-chip IC design.

A test mask 104 is generated that converts the IC design into one or more simplified, but representative, physical layouts for mask process development (block 502).

According to the present embodiments, a set of one or more SRAFs 402 are inserted into the test mask 104 for targeting the test mask (block 504). In one embodiment, the one or more SRAFs may be sized by printing a test wafer with SRAFs of varying sizes and using the SRAFs that are sized below a resolution limit of an imaging process, yet sufficiently large to allow mask targeting. The size of the SRAFs is currently limited by the resolution of measurement tool (e.g., a scanning electron microscope) and the noise of the mask making process. In one embodiment, the size of the SRAFs may be at least 50 nm to 100 nm. This number may decrease over time as improvements are made to both the mask making process and the metrology tools/capabilities. The SRAFs are designed at a size and pitch such that the largest SRAF does not print though all process variations. In one embodiment, the set of SRAFs may be provided with 1D and 2D features. In an embodiment, the set of SRAFs includes one or more features, but preferably, approximately 1 to 100 features are in the set.

The one or more SRAFs are then inserted into one or more other masks, such that the test mask and the one or more other masks include the same one or more SRAFs (block 506). In one embodiment, the phrase "the same one or more SRAFs" is intended to cover a set of SRAFs that are substantially the same size, shape, and pitch in the set of masks created during the mask process development. That is, the SRAFs used in one of the masks should not vary from corresponding SRAFs in another one of the masks more than a few hundred nanometers in pitch, tens of nanometers in width, and a few nanometers to a few microns in length.

Further details of block 506 as shown by the breakout lines are as follows. An optional mask proximity model 104 is generated from the test mask 104 (block 508). One or more optical proximity correction (OPC) test masks 106A-106X are also generated using the same mask process as performed for the mask proximity model 104, and the set of SRAFs 402 are inserted into the OPC test masks 106A-106X for targeting the OPC test masks 106A-106X (block 510).

One or more OPC models 108A-108Y are generated from the OPC test masks 106A-106X (block 512). In one embodiment, the OPC models 108A-108Y may be used to confirm through simulations that the sets of SRAFs will not print on the wafer.

One or more production masks 110A-110Z are generated from each of the OPC models 108A-108Y, and the set of SRAFs 402 are inserted the production masks 110A-110Z for targeting the production masks 110A-110Z (block 514).

Accordingly, the test mask 104, the OPC test masks 106A-106X, and the production masks 110A-110Z are all provided with the set of identical SRAFs for mask targeting despite the different process requirements of each of the masks and corresponding layers.

In one embodiment, the SRAFs are inserted in the place of traditional drop-in cells. Therefore, the SRAFs may be inserted based upon rules that govern the insertion of traditional drop-in cells. In one embodiment, the SRAFs are inserted in addition to traditional drop-in cells. In another embodiment, at least a portion of SRAFs originally inserted for resolution enhancement are designated to serve a dual purpose for both resolution enhancement as well as to serve as drop-in cells for mask targeting.

The disclosed embodiments for providing a mask process development having consistent mask targeting using SRAFs as standardized drop-in cells provides several advantages. On advantage is the process results in improved mask yield. In the previous approach, mask yield is degraded if the process isn't tweaked for every flavor of targeting feature. Even if the process is tweaked, the mask yield during development (prior to getting a separate baseline of approximately 30 masks for every mask targeting feature) is diminished.

Another advantage is the process results in a reduction in engineering/development time. The traditional process requires significantly more engineering development/time to fine-tune the process for each targeting feature.

A further advantage of the process is that it provides improved mask excursion prevention. That is, using the same SRAFs as a targeting feature across many different masks makes it easier to identify possible problems/flaws/drifts in the mask manufacturing process for a given mask process.

Yet a further advantage is that the process provides improved OPC models and reduced OPC model errors. By targeting the OPC model plates and production masks the same as during mask process development, the OPC model errors are reduced since the OPC model doesn't have to take into account systematic variable (different for different features used in the OPC model) mask error induced by targeting the masks differently. A consequence of this may result in improved wafer yield, reduced chip cost, reduced time to market/engineering time/fewer OPC churns.

Figure 6:
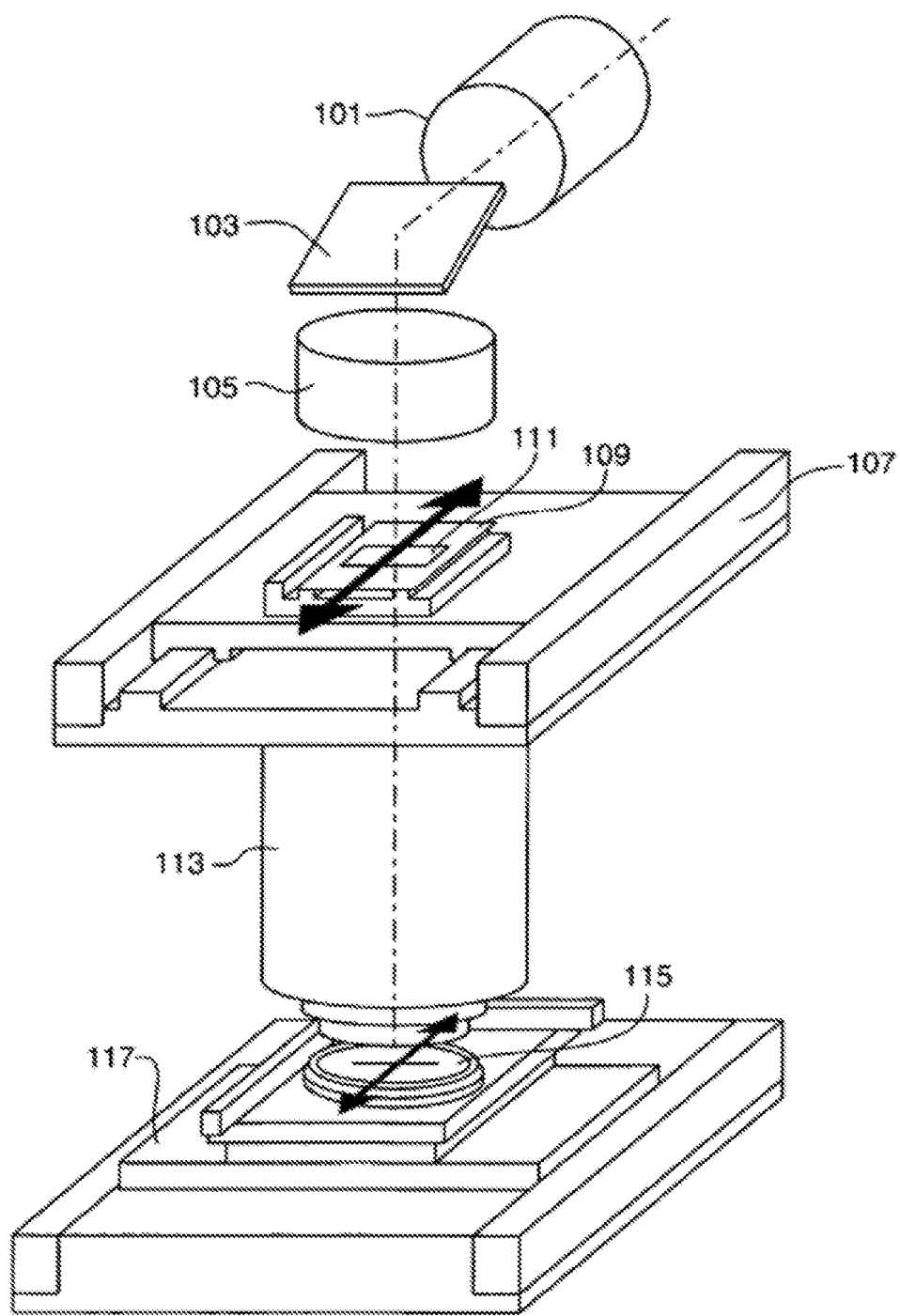
FIG. 6 shows a conventional semiconductor fabrication machine.

FIG. 6 shows a conventional semiconductor fabrication machine, in this case, a lens-scanning ArF Excimer Laser Stepper, that may be used to hold a mask or produce a wafer in accordance with embodiments of the present invention. The stepper is an example of a fabrication device that may benefit from embodiments of the present invention. Embodiments of the invention may also be applied to many other photolithography systems.

The stepper may be enclosed in a sealed vacuum chamber (not shown) in which the pressure, temperature and environment may be precisely controlled. The stepper has an illumination system including a light source 101, such as an ArF excimer laser, a scanning mirror 103, and a lens system 105 to focus the laser light on the wafer. A reticle scanning stage 107 carries a reticle 109 which holds the mask 111. The light from the laser is transmitted onto the mask and the light transmitted through the mask is focused further by a projection lens with, for example, a four-fold reduction of the mask pattern onto the wafer 115.

The mask 111 controls the size of each feature on the wafer. The mask design is made up of chrome metal lines, molybdenum silicide lines, or lines of some other material of different widths and shapes designed to create a particular pattern on the wafer. When OPC (Optical Proximity Correction) is applied to the mask, the mask is modified iteratively, primarily by modifying the widths of the metal lines and adding decorations to corners, until the photolithography model predicts that the final wafer will match the intended target design.

The wafer 115 is mounted to a wafer scanning stage 117. The reticle scanning stage and the wafer scanning stage are synchronized to move the reticle and the wafer together across the field of view of the laser. In one example, the reticle and wafer move across the laser light in a thin line, then the laser steps down and the reticle and wafer move across the laser in another thin line until the entire surface of the reticle and wafer have been exposed to the laser. Such a step and repeat scanning system allows a high intensity narrow beam light source to illuminate the entire surface of the wafer. The stepper is controlled by a station controller (not shown) which may control the starting, stopping and speed of the stepper as well as the temperature, pressure and chemical makeup of the ambient environment, among other factors.

Figure 7:
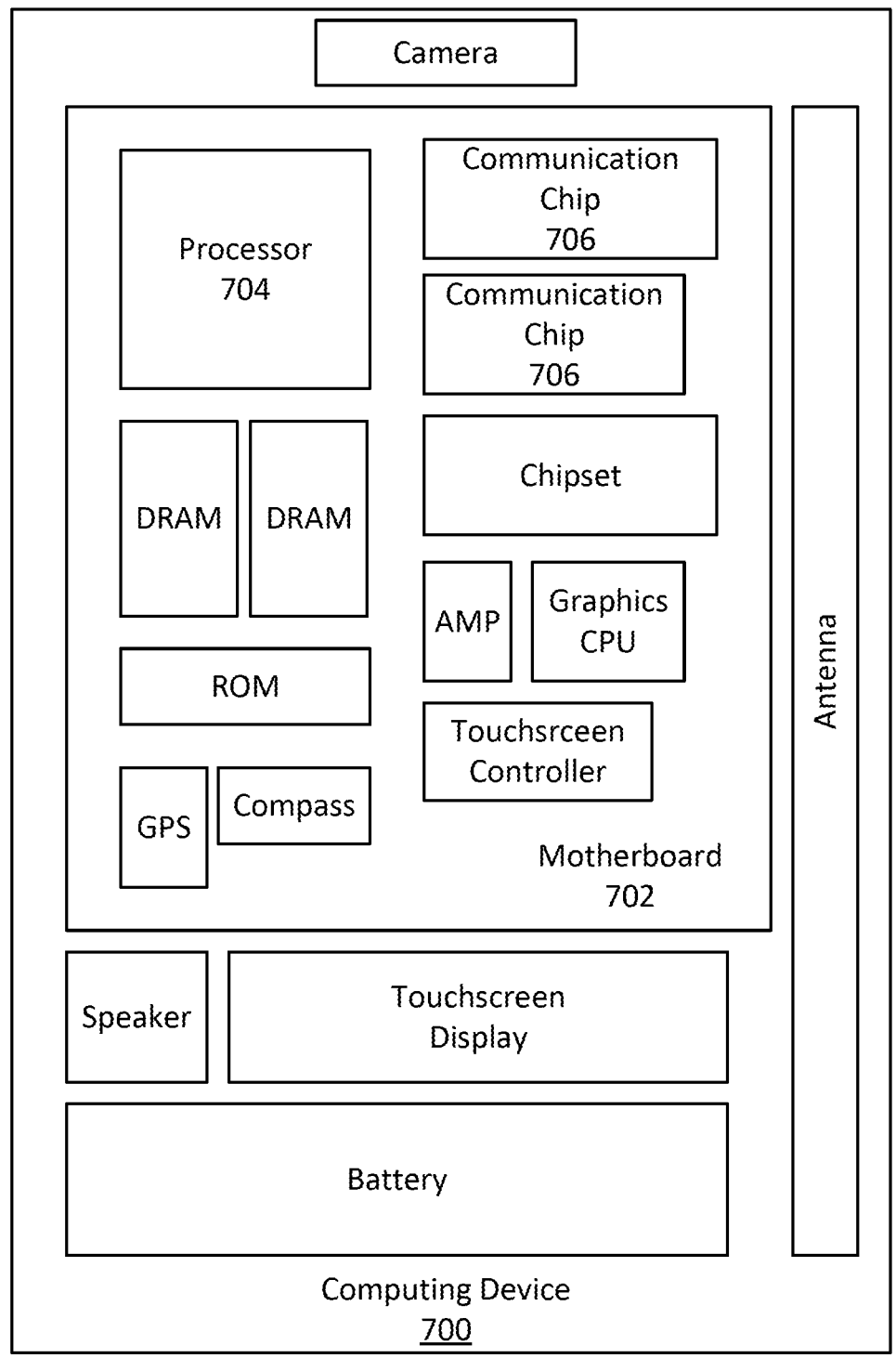
FIG. 7 illustrates a computing device representing an example of a system upon which features of the present invention may be implemented.

FIG. 7 illustrates a computing device 700 representing an example of a system upon which features of the present invention may be implemented. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of embodiments of the disclosure, the integrated circuit die of the communication chip includes one or more embedded non-volatile memory structures.

In further implementations, another component housed within the computing device 700 may contain an integrated circuit die that includes one or more embedded non-volatile memory structures.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A method having consistent mask targeting includes receiving an integrated circuit (IC) design. A test mask is generated that converts the IC design into a set of physical layouts for mask process development. A set of one or more sub-resolution assist features (SRAFs) is inserted into the test mask. The set of SRAFs is inserted into one or more other masks for mask targeting, such that the test mask and the one or more other masks include a same set of the one or more SRAFs.

Example embodiment 2: The method device of example embodiment 1, further comprising: sizing the set of one or more SRAFs by printing a test wafer with the set of SRAFs of varying sizes and using the SRAFs that are sized below a resolution limit of an imaging process, yet sufficiently large to allow the mask targeting.

Example embodiment 3: The method of example embodiment 1 or 2, further comprising: designing the one or more SRAFs at a size and pitch such that the largest SRAF does not print though all process variations.

Example embodiment 4: The method of example embodiment 1, 2 or 3, further comprising: providing the set of SRAFs with 1D and 2D features.

Example embodiment 5: The method of example embodiment 1, 2, 3 or 4, further comprising: providing the set of SRAFs with approximately 1 to 100 features.

Example embodiment 6: The method of example embodiment 1, 2, 3, 4 or 5, further comprising: generating a mask proximity model from the test mask.

Example embodiment 7: The method of example embodiment 1, 2, 3, 4, 5, or 6, further comprising: generating one or more optical proximity correction (OPC) test masks, and inserting the set of SRAFs into the one or more OPC test masks for targeting the OPC test masks.

Example embodiment 8: The method of example embodiment 7, further comprising: generating one or more OPC models from the OPC test masks.

Example embodiment 9: The method of example embodiment 8, further comprising: generating one or more production masks from the OPC models, and inserting the set of SRAFs into the production masks for targeting the production masks.

Example embodiment 10: The method of example embodiment 1, 2, 3, 4, 5, 6, 7, 8 or 9, further comprising: inserting the set of SRAFs based on rules that govern the insertion of the drop-in cells.

Example embodiment 11: The method of example embodiment 1, 2, 3, 4, 5, 6, 7, 8, 9, or 10, further comprising: designating at least a portion of the one or more SRAFs originally inserted for resolution enhancement to serve a dual purpose for both resolution enhancement and to serve as drop-in cells for mask targeting.

Example embodiment 12: An apparatus comprising a machine-readable medium having instructions which when executed by a machine cause the machine to perform operations comprising: receiving an integrated (IC) design. A test mask is generated that converts the IC design into one or more physical layouts. A set of one or more sub-resolution assist features (SRAFs) is inserted into the test mask. The set of SRAFs is inserted into one or more other masks for mask targeting, such that the test mask and the one or more other masks include a same set of the one or more SRAFs.

Example embodiment 13: The medium of example embodiment 12, further comprising: sizing the set of one or more SRAFs by printing a test wafer with the set of SRAFs of varying sizes and using the SRAFs that are sized below a resolution limit of an imaging process, yet sufficiently large to allow the mask targeting.

Example embodiment 14: The medium of example embodiment 12 or 13, further comprising: designing each of the SRAFs at a size and pitch such that the largest SRAF does not print though all process variations.

Example embodiment 15: The medium of example embodiment 12, 13, or 14, further comprising: providing the set of SRAFs with 1D and 2D features.

Example embodiment 16: The medium of example embodiment 12, 13, 14, or 15, further comprising: providing the set of SRAFs with approximately 20 to 30 features.

Example embodiment 17: The medium of example embodiment 12, 13, 14, 15, or 16, further comprising: generating a mask proximity model from the test mask.

Example embodiment 18: The medium of example embodiment 12, 13, 14, 15, 16, or 17, further comprising: generating one or more optical proximity correction (OPC) test masks, and inserting the set of SRAFs into the one or more OPC test masks for targeting the OPC test masks.

Example embodiment 19: The medium of example embodiment 18, further comprising: generating one or more OPC models from the OPC test masks.

Example embodiment 20: The medium of example embodiment 19, further comprising: generating one or more production masks from the OPC models, and inserting the set of SRAFs into the production masks for targeting the production masks.

Example embodiment 21: The method of example embodiment 12, 13, 14, 15, 16, 17, 18, 19, or 20, further comprising: inserting the set of SRAFs based on rules that govern the insertion of the drop-in cells.

Example embodiment 22: The medium of example embodiment 12, 13, 14, 15, 16, 17, 18, 19, 20, or 21, further comprising: designating at least a portion of the one or more SRAFs originally inserted for resolution enhancement to serve a dual purpose for both resolution enhancement and to serve as drop-in cells for mask targeting.

Example embodiment 23: A system comprises a test mask that converts an integrated circuit (IC) design into one or more physical layouts. The system includes one or more optical proximity correction (OPC) test masks. The system includes one or more production masks. The system further includes a set of one or more sub-resolution assist features (SRAFs) inserted into the test mask, the one or more OPC test masks, and the one or more production masks for mask targeting.

Example embodiment 24: The system of example embodiment 23, wherein the set of one or more SRAFs is sized by printing a test wafer with the set of SRAFs of varying sizes and using the SRAFs that are sized below a resolution limit of an imaging process, yet sufficiently large to allow the mask targeting.

Example embodiment 25: The system of example embodiment 23 or 24, wherein the SRAFs are designed at a size and pitch such that the largest SRAF does not print though all process variations.

What is claimed is:

1. A method comprising:
receiving an integrated circuit (IC) design;
generating a test mask that converts the IC design into one or more physical layouts;
inserting a set of one or more sub-resolution assist features (SRAFs) into the test mask; and
inserting the set of one or more SRAFs into one or more other masks for mask targeting, such that the test mask and the one or more other masks include a same set of the set of one or more SRAFs.

2. The method of claim 1, further comprising: sizing the set of one or more SRAFs by printing a test wafer with the set of one or more SRAFs of varying sizes and using the SRAFs that are sized below a resolution limit of an imaging process, yet sufficiently large to allow the mask targeting.

3. The method of claim 1, further comprising: designing the one or more SRAFs at a size and a pitch such that a largest SRAF does not print though all process variations.

4. The method of claim 1, further comprising: providing the set of one or more SRAFs with 1D and 2D features.

5. The method of claim 1, further comprising: providing the set of one or more SRAFs with approximately 1 to 100 features.

6. The method of claim 1, further comprising: generating a mask proximity model from the test mask.

7. The method of claim 6, further comprising: generating one or more optical proximity correction (OPC) test masks, and inserting the set of one or more SRAFs into the one or more OPC test masks for targeting the OPC test masks.

8. The method of claim 7, further comprising: generating one or more OPC models from the one or more OPC test masks.

9. The method of claim 8, further comprising: generating one or more production masks from the one or more OPC models, and inserting the set of one or more SRAFs into the one or more production masks for targeting the one or more production masks.

10. The method of claim 1, further comprising: inserting the set of one or more SRAFs based on rules that govern an insertion of drop-in cells.

11. The method of claim 1, further comprising: designating at least a portion of the set of one or more SRAFs originally inserted for resolution enhancement to serve a dual purpose for both resolution enhancement and to serve as drop-in cells for mask targeting.

12. An apparatus comprising a non-transitory machine-readable medium having instructions that, when executed by a machine, cause the machine to perform operations comprising:
receiving an integrated circuit (IC) design;
generating a test mask that converts the IC design into one or more physical layouts;
inserting a set of one or more sub-resolution assist features (SRAFs) into the test mask; and
inserting the set of one or more SRAFs into one or more other masks for mask targeting, such that the test mask and the one or more other masks include a same set of the set of one or more SRAFs.

13. The apparatus of claim 12, further configured to cause the machine to perform an operation comprising: sizing the set of one or more SRAFs by printing a test wafer with the set of one or more SRAFs of varying sizes and using the SRAFs that are sized below a resolution limit of an imaging process, yet sufficiently large to allow the mask targeting.

14. The apparatus of claim 12, further configured to cause the machine to perform an operation comprising: designing each of the SRAFs at a size and a pitch such that a largest SRAF does not print though all process variations.

15. The apparatus of claim 12, further configured to cause the machine to perform an operation comprising: providing the set of one or more SRAFs with 1D and 2D features.

16. The apparatus of claim 12, further configured to cause the machine to perform an operation comprising: providing the set of one or more SRAFs with approximately 1 to 100 features.

17. The apparatus of claim 12, further configured to cause the machine to perform an operation comprising: generating a mask proximity model from the test mask.

18. The apparatus of claim 17, further configured to cause the machine to perform an operation comprising: generating one or more optical proximity correction (OPC) test masks, and inserting the set of one or more SRAFs into the one or more OPC test masks for targeting the OPC test masks.

19. The apparatus of claim 18, further configured to cause the machine to perform an operation comprising: generating one or more OPC models from the one or more OPC test masks.

20. The apparatus claim 19, further configured to cause the machine to perform an operation comprising: generating one or more production masks from the one or more OPC models, and inserting the set of one or more SRAFs into the one or more production masks for targeting the one or more production masks.

21. The apparatus of claim 12, further configured to cause the machine to perform an operation comprising: inserting the set of one or more SRAFs based on rules that govern an insertion of the drop-in cells.

22. The apparatus of claim 12, further configured to cause the machine to perform am operation comprising: designating at least a portion of the set of one or more SRAFs originally asserted for resolution enhancement to serve a dual purpose for both resolution enhancement and to serve as drop-in cells for mask targeting.

23. A system comprising:
a test mask that converts an integrated circuit (IC) design into one or more physical layouts;
one or more optical proximity correction (OPC) test masks;
one or more production masks; and
a set of one or more sub-resolution assist features (SRAFs) inserted into the test mask, the one or more OPC test masks, and the one or more production masks for mask targeting.

24. The system of claim 23, wherein the set of one or more SRAFs is sized by printing a test wafer with the set of one or more SRAFs of varying sizes and using the SRAFs that are sized below a resolution limit of an imaging process, yet sufficiently large to allow the mask targeting.

25. The system of claim 23, wherein the set of one or more SRAFs are designed at a size and a pitch such that a largest SRAF does not print though all process variations.

* * * * *